(12) United States Patent
Shu et al.

(10) Patent No.: US 10,707,449 B2
(45) Date of Patent: Jul. 7, 2020

(54) ARRAY SUBSTRATE, METHOD OF PREPARING THE SAME AND DISPLAY PANEL

(71) Applicant: BOE Technology Group Co., Ltd., Beijing (CN)

(72) Inventors: Shi Shu, Beijing (CN); Chuanxiang Xu, Beijing (CN); Jiangnan Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/120,944

(22) Filed: Sep. 4, 2018

(65) Prior Publication Data

US 2019/0097179 A1 Mar. 28, 2019

(30) Foreign Application Priority Data

Sep. 28, 2017 (CN) .......................... 2017 1 0900396

(51) Int. Cl.
*H01L 51/52* (2006.01)
*H01L 27/32* (2006.01)
*H01L 51/56* (2006.01)

(52) U.S. Cl.
CPC ........ *H01L 51/5284* (2013.01); *H01L 27/322* (2013.01); *H01L 27/3244* (2013.01); *H01L 51/5253* (2013.01); *H01L 51/56* (2013.01); *H01L 27/3248* (2013.01); *H01L 27/3276* (2013.01); *H01L 2227/323* (2013.01)

(58) Field of Classification Search
None
See application file for complete search history.

(56) References Cited

U.S. PATENT DOCUMENTS

| 9,123,674 | B2 | 9/2015 | Yamakita |
| 9,423,832 | B2 | 8/2016 | Jeoung et al. |
| 9,666,649 | B2 | 5/2017 | Choi et al. |
| 10,141,382 | B2 | 11/2018 | Choi et al. |

(Continued)

FOREIGN PATENT DOCUMENTS

| CN | 1906503 A | 1/2007 |
| CN | 104299980 A | 1/2015 |

(Continued)

OTHER PUBLICATIONS

First Office Action, including Search Report, for Chinese Patent Application No. 201710900396.9 dated Jul. 23, 2019, 20 pages.

(Continued)

*Primary Examiner* — Herve-Louis Y Assouman
(74) *Attorney, Agent, or Firm* — Westman, Champlin & Koehler, P.A.

(57) ABSTRACT

An array substrate, a method of preparing the array substrate, and a display panel are provided, the method of preparing the array substrate includes: providing a base substrate; forming a plurality of light emitting devices arranged in an array on the base substrate; covering the base substrate, on which the plurality of light emitting devices are formed, with a black matrix material; activating the plurality of light emitting devices to expose the black matrix material; and developing the exposed black matrix material to form a black matrix.

9 Claims, 6 Drawing Sheets

(56) References Cited

U.S. PATENT DOCUMENTS

| | | | |
|---|---|---|---|
| 2003/0122140 A1* | 7/2003 | Yamazaki | H01L 21/67207 257/88 |
| 2003/0181122 A1* | 9/2003 | Collins, III | H01L 33/44 445/24 |
| 2007/0070507 A1 | 3/2007 | Yee et al. | |
| 2015/0021571 A1 | 1/2015 | Yamakita | |
| 2015/0168827 A1* | 6/2015 | Yang | G02B 1/04 430/280.1 |
| 2015/0194474 A1 | 7/2015 | Choi et al. | |
| 2015/0255505 A1 | 9/2015 | Jeoung et al. | |
| 2016/0300889 A1 | 10/2016 | Kim et al. | |
| 2017/0237041 A1 | 8/2017 | Choi et al. | |

FOREIGN PATENT DOCUMENTS

| | | | |
|---|---|---|---|
| CN | 104766928 A | 7/2015 | |
| CN | 106063378 A | 10/2016 | |

OTHER PUBLICATIONS

Second Office Action, including Search Report, for Chinese Patent Application No. 201710900396.9, dated Mar. 20, 2020, 17 pages.

\* cited by examiner

ARRAY SUBSTRATE, METHOD OF PREPARING THE SAME AND DISPLAY PANEL

CROSS-REFERENCE TO RELATED APPLICATION

This application claims priority to Chinese Patent Application No. 201710900396.9 filed on Sep. 28, 2017 in the State Intellectual Property Office of China, the disclosure of which is hereby incorporated by reference in its entirety.

TECHNICAL FIELD

The present disclosure relates to the field of optoelectronic display technologies, and in particular, to an array substrate, a method of preparing the array substrate, and a display panel.

DESCRIPTION OF THE RELATED ART

At present, the share of OLED display products in the small-sized products is getting higher and higher, and the OLED display products are also gradually used in the middle-size products. It is expected that the OLED display products will accelerate development in the future. Flexibility and ultra-high resolution are the main development directions of the OLED display products in the future.

SUMMARY

An embodiment of the present disclosure provides a method of preparing an array substrate, comprising: providing a base substrate, forming a plurality of light emitting devices arranged in an array on the base substrate; covering the base substrate, on which the plurality of light emitting devices are formed, with a black matrix material; activating the plurality of light emitting devices to expose the black matrix material; and developing the exposed black matrix material to form a black matrix.

In some embodiments, before the step of activating the plurality of light emitting devices to expose the black matrix material, the method further comprises: removing the black matrix material on a peripheral electrode in a peripheral region of the base substrate to expose the peripheral electrode by a patterning process, the peripheral electrode being used for providing a driving signal to the plurality of light emitting devices; and wherein the step of activating the plurality of light emitting devices to expose the black matrix material comprises: providing the driving signal by the peripheral electrode to activate the plurality of light emitting devices to expose the black matrix material.

In some embodiments, the step of forming a plurality of light emitting devices arranged in an array on the base substrate comprises: forming a plurality of first electrodes arranged in an array on the base substrate; forming a pixel defining layer on the base substrate on which the plurality of first electrodes are formed; and forming a light emitting function layer and a second electrode layer in sequence on the base substrate on which the pixel defining layer is formed, wherein the pixel defining layer defines a plurality of light emitting regions arranged in an array, the plurality of light emitting regions are in one-to-one correspondence with the plurality of first electrodes, an orthographic projection of each of the light emitting regions on the base substrate falls within an orthographic projection of the corresponding first electrode on the base substrate, and wherein each of the light emitting function layer and the second electrode layer covers at least the plurality of light emitting regions.

In some embodiments, the method further comprising: forming a plurality of color filter layers arranged in an array on the base substrate on which the black matrix is formed, wherein the plurality of color filter layers are in one-to-one correspondence with the plurality of light emitting regions, and an orthographic projection of each of the plurality of color filter layers on the base substrate covers an orthographic projection of the corresponding light emitting region on the base substrate.

In some embodiments, the method further comprising: forming a first planarization layer on both the black matrix and the plurality of color filter layers.

In some embodiments, before the step of covering the base substrate on which the plurality of light emitting devices are formed with a black matrix material, the method further comprises: forming a thin film packaging layer on the second electrode layer.

In some embodiments, the thin film packaging layer is an inorganic thin film or an inorganic-organic composite thin film.

In some embodiments, before the step of forming a plurality of light emitting devices arranged in an array on the base substrate, the method further comprises: forming a plurality of thin film transistors arranged in an array on the base substrate, wherein the plurality of thin film transistors are in one-to-one correspondence with the plurality of first electrodes, and a source electrode or a drain electrode of each of plurality of the thin film transistors is electrically connected to the corresponding first electrode.

In some embodiments, before the step of forming a plurality of thin film transistors arranged in an array on a base substrate, the method further comprises: forming a buffer layer on the base substrate, wherein the plurality of thin film transistors arranged in the array are formed on the buffer layer.

In some embodiments, the black matrix material comprises a positive photoresist containing black pigments.

An embodiment of the present disclosure provides an array substrate comprising: a base substrate; a plurality of light emitting devices arranged in an array on the base substrate, each of the plurality of light emitting devices having a light emitting region; and a black matrix on a side of the plurality of light emitting devices facing away from the base substrate, the black matrix defining a plurality of openings, wherein the plurality of openings are in one-to-one correspondence with the light emitting regions of the plurality of light emitting devices, and a deviation of an alignment between each of the plurality of openings and the corresponding light emitting region is less than a threshold.

In some embodiments, the array substrate further comprising a peripheral electrode in a peripheral region of the base substrate, wherein the peripheral electrode is used for providing a driving signal to activate the plurality of light emitting devices.

In some embodiments, the array substrate further comprising a pixel defining layer on the base substrate, the pixel defining layer defining the plurality of light emitting regions, wherein each of the plurality of light emitting device comprises: a first electrode on the base substrate; a light emitting function layer on the first electrode; and a second electrode on the light emitting function layer, wherein both the light emitting function layer and the second electrode cover at least the light emitting region of the corresponding light emitting device, and wherein the pixel defining layer is located on a side of first electrodes of the plurality of light emitting devices facing away from the base substrate.

In some embodiments, second electrodes of the plurality of light emitting devices constitute a continuous second electrode layer, and/or light emitting function layers of the plurality of light emitting devices constitute a continuous layer.

In some embodiments, the array substrate further comprising: a plurality of color filter layers on the black matrix, wherein the plurality of color filter layers are in one-to-one correspondence with the plurality of light emitting regions, and an orthographic projection of each of plurality of color filter layers on the base substrate covers an orthographic projection of the corresponding light emitting region on the base substrate.

In some embodiments, the array substrate further comprising: a first planarization layer on both the black matrix and the plurality of color filter layers.

In some embodiments, the array substrate further comprising: a thin film packaging layer between the second electrodes of the plurality of light emitting devices and the black matrix, wherein the second electrodes of the plurality of light emitting devices are covered by the thin film packaging layer.

In some embodiments, the array substrate further comprising: a plurality of thin film transistors arranged in an array on the base substrate, wherein the plurality of thin film transistors are in one-to-one correspondence with the plurality of first electrodes, and a source electrode or a drain electrode of each of the plurality of thin film transistors is electrically connected to the corresponding first electrode.

In some embodiments, the array substrate further comprising: a buffer layer between the base substrate and the plurality of thin film transistors arranged in an array.

An embodiment of the present disclosure provides a display panel comprising the array substrate according to the above embodiments.

BRIEF DESCRIPTION OF THE DRAWINGS

In order to more clearly illustrate the technical solutions of the embodiments of the present disclosure, the drawings to be used in the description of the embodiments of the present disclosure will be briefly described below. It is obvious that the drawings in the following description are merely some embodiments of the present disclosure. For those skilled in the art, other drawings may also be obtained based on these drawings without inventive works.

DETAILED DESCRIPTION OF THE EMBODIMENTS

In order to make the objects, features and advantages of the present disclosure be clearly understood. The present disclosure will be further described in detail below with reference to the accompanying drawings and specific embodiments.

The thickness of the OLED display panel needs to be reduced as much as possible for flexibility. At present, the thickness of the OLED panel may be about 100 um. However, in order to reduce the reflectance, a circular polarizer needs to be attached to the OLED display panel, so that the whole OLED display panel has an increased thickness and may not be bent freely. Thus, a black matrix is required so as to reduce the reflectance while ensuring product flexibility. In the related art, the black matrix is formed by an evaporation process with an evaporation mask. Due to the limitations of the evaporation mask, the yield of the product with an ultra-high resolution such as 600 PPI or more is difficult to ensure. Moreover, it is also very easy to generate low light utilization due to a misalignment of the evaporation mask.

The present disclosure provides a method of preparing an array substrate, an array substrate, and a display panel, which may improve product resolution and light utilization while ensuring flexibility of the display panel and reducing reflectance.

Figure 1:
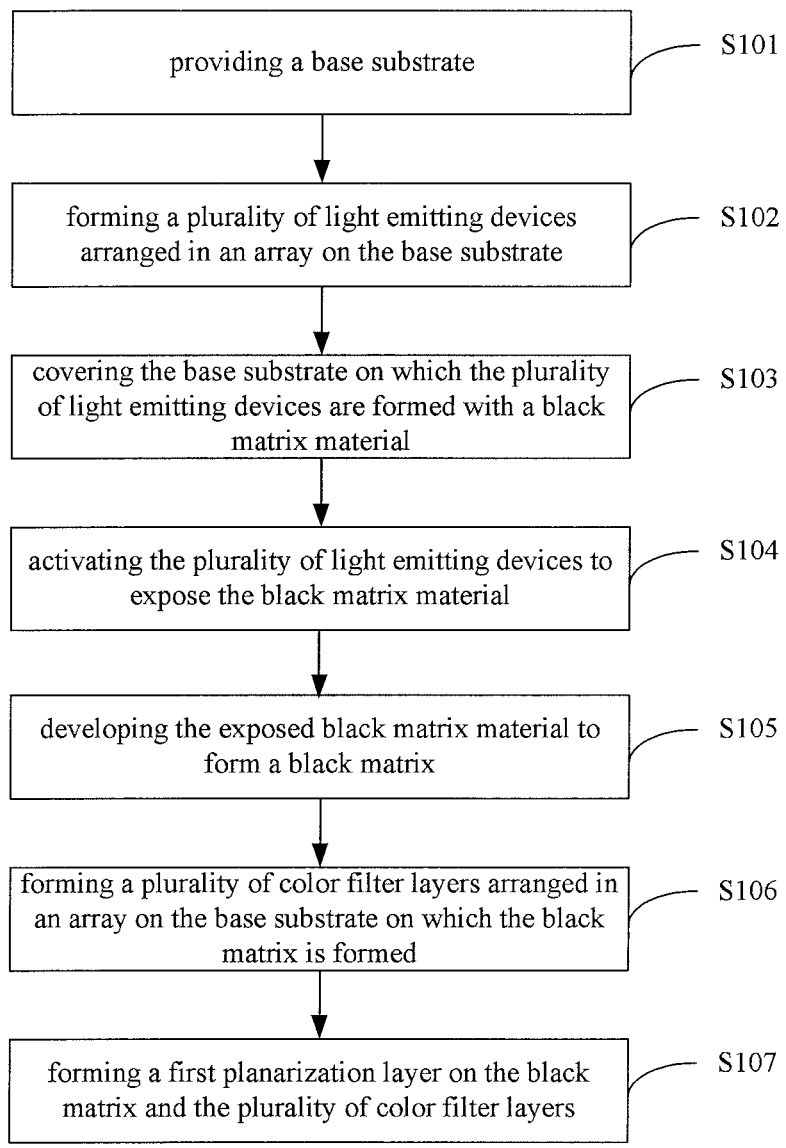
FIG. 1 is a flow chart showing steps of a method of preparing an array substrate according to an embodiment of the present disclosure.

FIG. 1 is a flow chart showing steps of a method of preparing an array substrate according to an embodiment of the present disclosure. Referring to FIG. 1, the method includes:

Step S101: providing a base substrate;

Step S102: forming a plurality of light emitting devices arranged in an array on the base substrate;

Step S103: covering the base substrate on which the plurality of light emitting devices are formed with a black matrix material;

Step S104: activating the plurality of light emitting devices to expose the black matrix material;

Step S105: developing the exposed black matrix material to form a black matrix.

Figure 2:
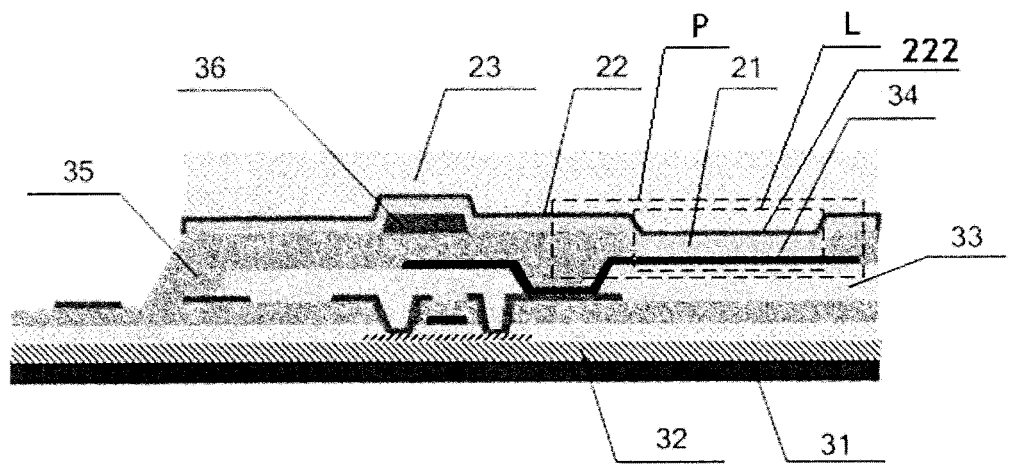
FIGS. 2-6 are schematic cross-sectional views of an array substrate formed after completing each step in the method of preparing an array substrate provided in FIG. 1.
Figure 11:
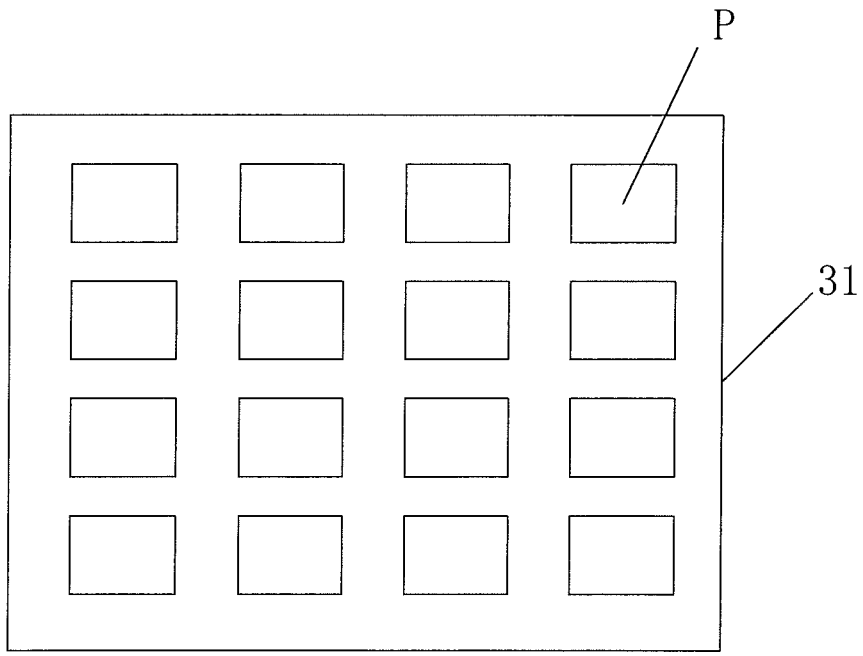
FIG. 11 is a schematic plan view of an array substrate formed after completing step 102 in the method of preparing an array substrate provided in FIG. 1.

FIG. 2 is a cross-sectional structural view of the array substrate formed after the step S102 in the method of preparing the array substrate provided in FIG. 1 is completed, and FIG. 11 is schematic plan view of the array substrate formed after completing step 102 in the method of preparing the array substrate provided in FIG. 1. As shown in FIG. 2 and FIG. 11, each of the light emitting devices P arranged in an array on the base substrate 31 includes a first electrode 34 (e.g., an anode), a light emitting function layer 21 (e.g., an organic light emitting function layer) and a second electrode 222 (e.g., a cathode). The first electrode 34, the light emitting function layer 21 and the second electrode 22 are sequentially disposed away from the base substrate 31. In this embodiment, the plurality of second electrodes 222 of the plurality of light emitting devices P collectively constitute a continuous second electrode layer 22, and the plurality of light emitting function layers 21 of the plurality of light emitting devices P collectively constitute a continuous layer. In other embodiments, the plurality of second electrodes 222 of the plurality of light emitting devices P may be spaced apart from each other and/or the plurality of light emitting function layers 21 of the plurality of light emitting devices P may be spaced apart from each other.

The array substrate may further include a thin film packaging layer 23 formed on a surface of the second electrode layer 22, as shown in FIG. 2.

Figure 3:
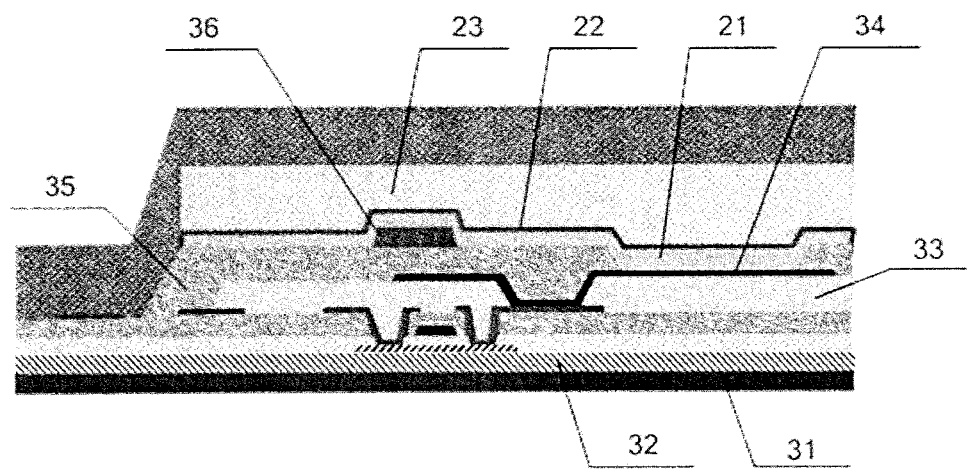

In step S103, specifically, a surface of the base substrate on which the second electrode layer 22 or the thin film packaging layer 23 is formed may be coated with the black matrix material. The black matrix material may be a positive photoresist containing black pigments. Referring to FIG. 3, FIG. 3 is a cross-sectional structural view of the array substrate formed after the step S103 in the method of preparing the array substrate provided in FIG. 1 is completed.

Specifically, in step 104, the light emitting devices P may be activated by a peripheral electrode 37 located in a peripheral region of the base substrate 31, light emitted from a light emitting region L of each of the light emitting devices P exposes a portion of the black matrix material which is directly above the light emitting region L, so that a self-alignment between the black matrix 10 to be formed and the light emitting regions L may be achieved.

Figure 4:
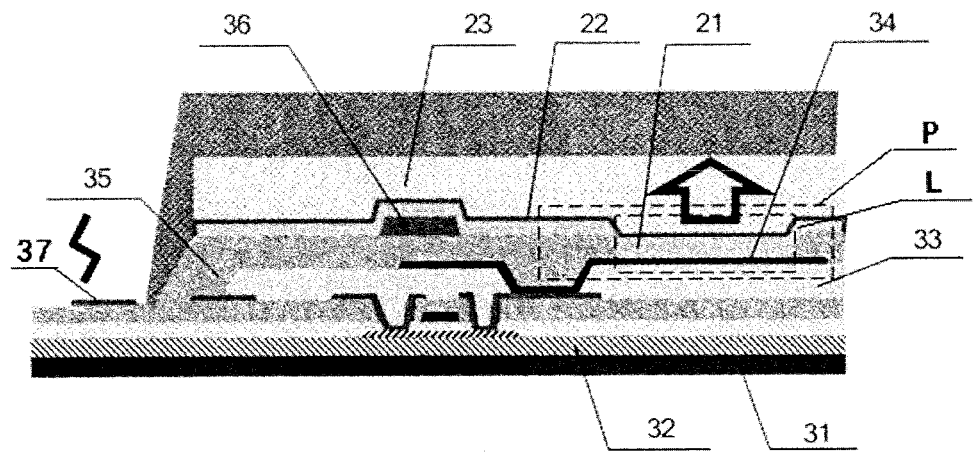

In order to power the peripheral electrode 37, a surface of the peripheral electrode 37 may not be covered with the black matrix material. The peripheral electrode may be protected during the coating process of the black matrix material. Alternatively, the black matrix material covering the peripheral electrode may be removed before the peripheral electrode is powered. For example, in one implementation, first, the black matrix material covering the surface of the peripheral electrode on the base substrate is removed by a patterning process such as exposure and development; then the black matrix material is exposed by powering the peripheral electrode to lighten the light emitting region. FIG. 4 is a cross-sectional structural view of the array substrate formed after the step of patterning the black matrix material to remove the portion of black matrix material on the peripheral electrode.

Figure 5:
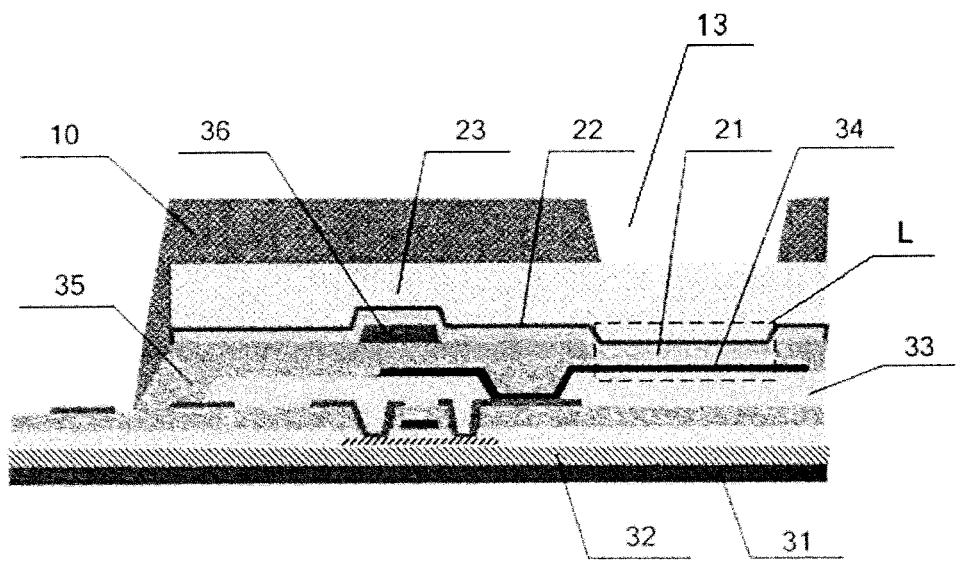

In step 105, specifically, the exposed black matrix material may be developed by a conventional technique to form a black matrix 10. FIG. 5 is a cross-sectional structural view of the array substrate formed after the step S105 in the method of preparing the array substrate provided in FIG. 1 is completed. The black matrix 10 formed by the preparation method of the present embodiment has a plurality of openings 13 arranged in array and corresponding to the light emitting regions L of the light emitting devices P. A deviation of an alignment between the opening 13 and the corresponding light emitting region L is smaller than a threshold. In general, the threshold may be 0.5 µm, that is, the deviation of the alignment between the opening 13 and the corresponding light emitting region L is between 0 µm and 0.5 µm. The deviation of the alignment may even reach 0 µm without considering other factors such as coating and development.

In this embodiment, as shown in FIG. 1, the method of preparing the array substrate may further include:

Step S106: forming a plurality of color filter layers arranged in an array on the base substrate on which the black matrix is formed.

Step S107: forming a first planarization layer on the black matrix and the plurality of color filter layers.

Figure 6:
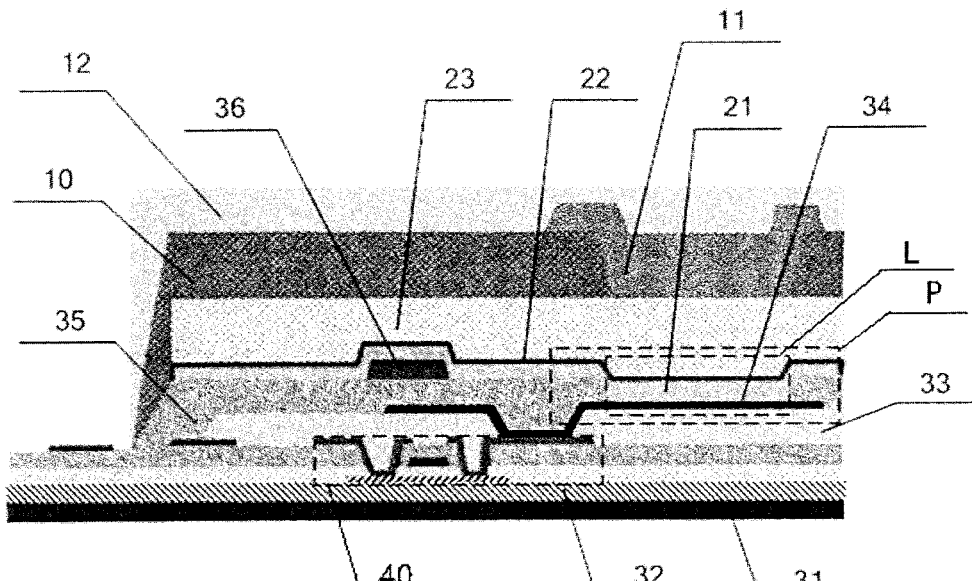

FIG. 6 is a cross-sectional structural view of the array substrate formed after the step S107 in the method of preparing the array substrate provided in FIG. 1 is completed. In practical applications, in order to achieve color display, a plurality of color filter layers 11 may be formed on the black matrix 10 by a patterning process such as photolithography or the like, the plurality of color filter layers 11 are in one-to-one correspondence with the plurality of light emitting regions L of the plurality of light emitting devices. An orthographic projection of each color filter layer 11 on the base substrate 31 covers an orthographic projection of the corresponding light emitting region L of the light emitting device P on the base substrate 31. The first planarization layer 12 covers the black matrix 10 and the color filter layers 11.

The embodiment provides a method of preparing an array substrate. In the preparation method, the black matrix material is exposed by activating the light emitting devices on the base substrate, and then developed to obtain a black matrix. Each of light emitting regions of the light emitting devices expose the corresponding portion of the black matrix material, so that the self-alignment is achieved and the problem of the deviation of the alignment between the black matrix and the light emitting regions is avoided, thereby improving the light utilization efficiency. Meanwhile, the black matrix may replace the circular polarizer to reduce the reflectivity of the display panel, thereby ensuring the flexibility of the display panel. The limitation of the evaporation mask in the existing process may be avoided so that the resolution of the product may be further improved.

Figure 7:
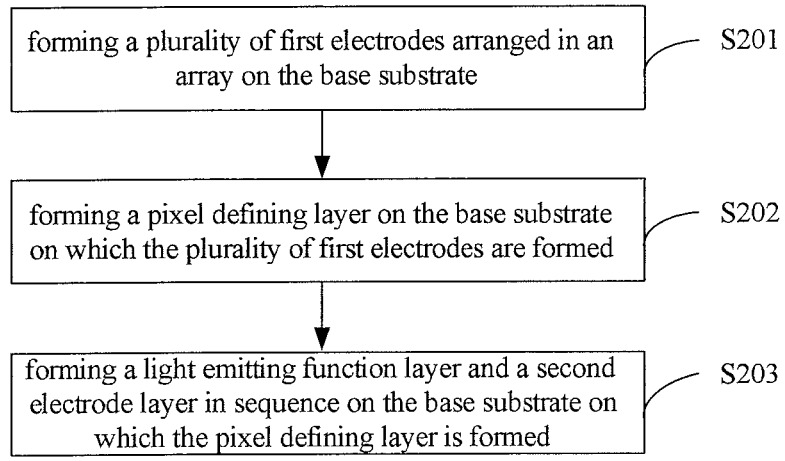
FIG. 7 is a flow chart showing steps of forming a plurality of light emitting devices arranged in an array on a base substrate according to an embodiment of the present disclosure.

In an embodiment, FIG. 7 is a flow chart of forming a plurality of light emitting devices arranged in an array on the base substrate according to an embodiment of the present disclosure. As shown in FIG. 7, step S102 of forming a plurality of light emitting devices arranged in an array on the base substrate may include the following steps:

Step S201: forming a plurality of first electrodes arranged in an array on the base substrate;

Step S202: forming a pixel defining layer on the base substrate on which the plurality of first electrodes are formed;

Step S203: forming a light emitting function layer and a second electrode layer in sequence on the base substrate on which the pixel defining layer is formed.

In step S201, the plurality of first electrodes 34 arranged in the array may be formed by a conventional patterning process such as deposition, photolithography, etching and the like.

In step S202, the pixel defining layer 35 may be formed by a conventional patterning process such as deposition, photolithography, etching and the like. The pixel defining layer defines the plurality of light emitting regions L in an array. The plurality of light emitting regions L are in one-to-one correspondence with the plurality of first electrodes 34, and an orthographic projection of each of the light emitting regions on the base substrate 31 falls within an orthographic projection of the corresponding first electrode 34 on the base substrate 31.

In some embodiments, a spacer 36 may also be formed on the pixel defining layer 35 for supporting an evaporation mask which is employed for subsequently forming the light emitting function layer and the second electrode layer.

In step S203, the light emitting function layer 21 may be formed on the base substrate on which the pixel defining layer 35 is formed by evaporation or the like, and the second electrode layer 22 may be formed on the light emitting function layer 21 by evaporation or sputtering or the like. Each of the light emitting function layer and the second electrode layer covers at least the plurality of light emitting regions L. The light emitting function layer 21 and the second electrode layer 22 constitute a core layer of an electroluminescent device, such as an OLED device. In this embodiment, the OLED device is, for example, a white light emitting device. Under an action of white light emitted by the OLED device, a region of the aforementioned black matrix material irradiated by the white light is changed in characteristics, the black matrix material is, for example, a positive photoresist containing black pigments, and the region irradiated by the white light may be removed with developer.

In practical applications, in order to protect and isolate the organic light emitting layer, a thin film packaging layer is further required to improve the reliability of the display panel. The thin film packaging layer may be an inorganic thin film or an inorganic-organic composite thin film. The thin film packaging layer may be formed on the second electrode layer as described above. In other embodiments, the thin film packaging layer may be formed on the black matrix, and may be formed on the color filter layers. The specific location of the thin film packaging layer needs to be determined according to the actual process and the structure design, which is not specifically limited in the present disclosure.

In an embodiment, before step S103, the method of preparing the array substrate further includes: forming a thin film packaging layer 23 on the second electrode layer 22.

Specifically, the thin film packaging layer 23 may be formed on the second electrode layer 22. Referring to FIG. 2, the thin film packaging layer 23 is used to protect the light emitting function layer 21, thereby avoiding contamination of the luminescent function layer 21 during subsequent processes such as exposure, development, and the like, and improving reliability of the display panel. The thin film packaging layer 23 may be the inorganic thin film or the inorganic-organic composite thin film.

In practical applications, in order to further protect and isolate the organic light emitting layer, a second thin film packaging layer may be further formed. The second thin film packaging layer may be an inorganic thin film or an inorganic-organic composite thin film. The second thin film packaging layer may be formed on a black matrix or may be formed on a color filter layers. The specific location of the second thin film packaging layer needs to be determined according to the actual process and the structure design, which is not specifically limited in the present disclosure.

Figure 8:
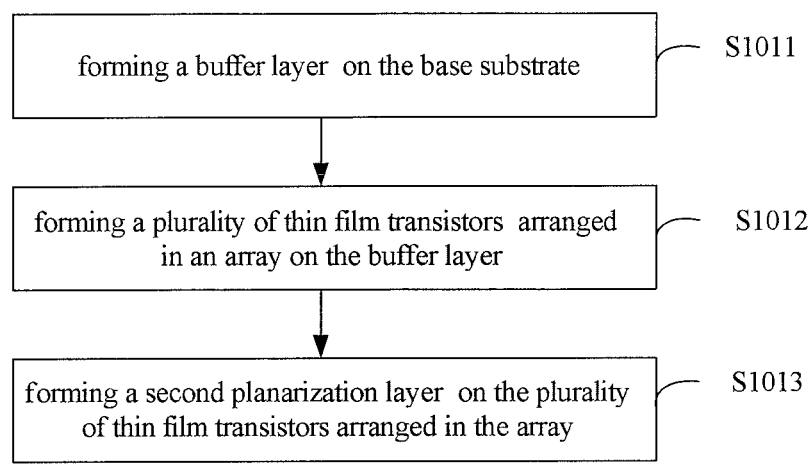
FIG. 8 is a flow chart showing steps of forming a driving circuit in the method of preparing an array substrate according to an embodiment of the present disclosure.
Figure 9:
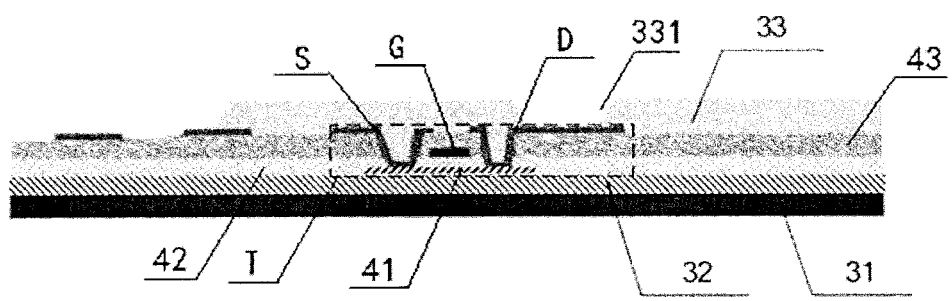
FIG. 9 is a cross-sectional structural view of an array substrate after forming a driving circuit according to an embodiment of the present disclosure.

FIG. 8 is a flow chart showing steps of forming a driving circuit in a method of preparing an array substrate according to an embodiment of the present disclosure. FIG. 9 is a cross-sectional structural view of an array substrate after forming the driving circuit. In an embodiment, before step S102 of forming a plurality of light emitting devices arranged in an array on the base substrate, as shown in FIGS. 8 and 9, the method of preparing the array substrate further includes:

Step 1011: forming a buffer layer 32 on the base substrate 31;

Step 1012: forming a plurality of thin film transistors T arranged in an array on the buffer layer 32;

Step 1013: forming a second planarization layer 33 on the plurality of thin film transistors T arranged in the array.

Specifically, the base substrate 31 may be glass substrate or a flexible substrate or the like.

In step 1013, a via hole 331 is formed in the second planarization layer 33 such that each of the first electrodes to be subsequently formed may be electrically connected to a source electrode S or a drain electrode D of the corresponding thin film transistor T through the via hole 331.

It will be understood by those skilled in the art that the step of forming the buffer layer and the step of forming the second planarization layer is not necessary, and in some embodiments, at least one of the step of forming the buffer layer and the step of forming the second planarization layer may be omitted.

Figure 10:
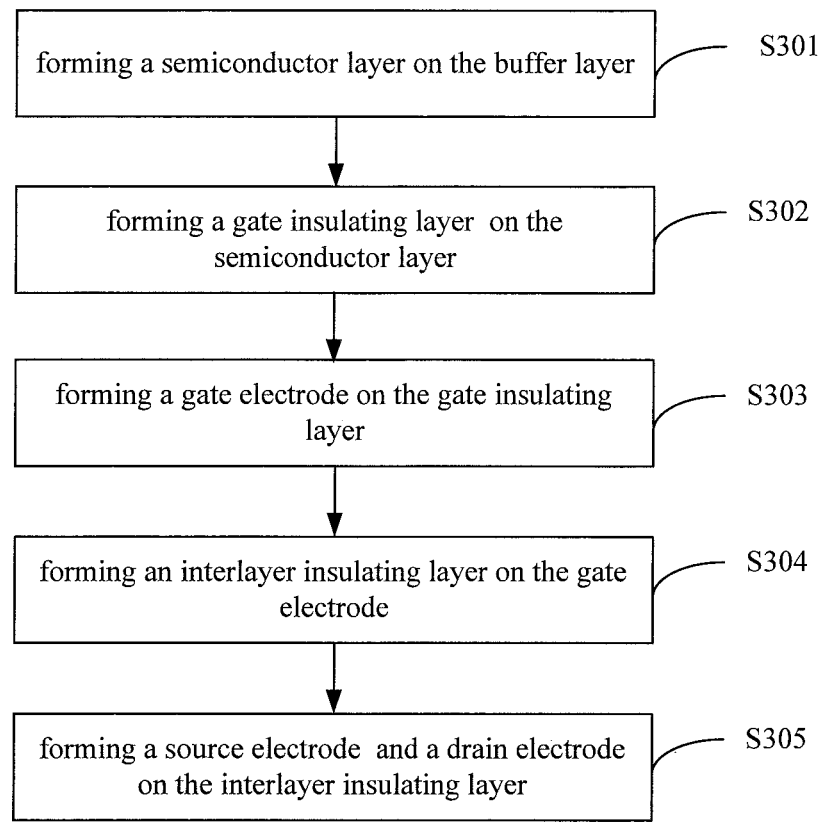
FIG. 10 is a flow chart showing steps of forming a plurality of thin film transistors arranged in an array according to an embodiment of the present disclosure.

FIG. 10 illustrates a flow chart of forming a plurality of thin film transistors arranged in an array according to an embodiment of the present disclosure. In an embodiment, as shown in FIGS. 9 and 10, step 1012 of forming a plurality of thin film transistors T arranged in an array on the buffer layer 32 may include:

Step 301: forming a semiconductor layer 41 on the buffer layer 32;

Step 302: forming a gate insulating layer 42 on the semiconductor layer 41;

Step 303: forming a gate electrode G on the gate insulating layer 42;

Step 304: forming an interlayer insulating layer 43 on the gate electrode G;

Step 305: forming a source electrode S and a drain electrode D on the interlayer insulating layer 43.

Specifically, the semiconductor layer 41 may be a low-temperature polysilicon layer or the like. The above steps are described by taking a top gate type thin film transistor as an example. In other embodiments, the thin film transistor may also be a bottom gate type.

An embodiment of the present disclosure provides an array substrate, and FIG. 6 is a schematic cross-sectional view of an array substrate according to an embodiment of the present disclosure. The array substrate may include a base substrate 31, a plurality of light emitting devices P arranged in an array on the base substrate, and a black matrix 10 on the side of the plurality of light emitting devices P facing away from the base substrate 31. The black matrix 10 defines a plurality of openings 13 in an array, and the plurality of openings 13 are in one-to-one correspondence with a plurality of light emitting regions L of the plurality of light emitting devices. A deviation of an alignment between each of the plurality of openings 13 and the corresponding light emitting region L is less than a threshold.

Specifically, the black matrix material covering the light emitting regions L of the light emitting devices P may be exposed by activating the light emitting device P of the array substrate and then be developed to form the plurality of openings. A deviation of an alignment between each opening 13 and the corresponding light emitting region L is smaller than a threshold. In general, the threshold may be 0.5 μm, that is, the deviation of the alignment between the opening 13 and the corresponding light emitting region L is between 0 μm and 0.5 μm. The deviation of the alignment may even reach 0 μm without considering other factors such as coating and development.

Optionally, the array substrate may further include a peripheral electrode 37 located at a periphery of the base substrate 31, and the peripheral electrode 37 is used to activate the light emitting devices P. The black matrix material may be a positive photoresist containing black pigments.

In an embodiment, the array substrate may further include a plurality of color filter layers 11 on the black matrix 10. The plurality of color filter layers 11 are in one-to-one correspondence with the plurality of light emitting regions L of the plurality of light emitting devices P, and an orthographic projection of each of the color filter layers 11 on the base substrate covers an orthographic projection of the corresponding light emitting region L on the base substrate. The array substrate may further include a first planarization layer 12 on the black matrix 10 and the plurality of color filter layers 11, as shown in FIG. 6.

In an embodiment, the array substrate further includes a pixel defining layer 35 disposed on the base substrate 31, and the pixel defining layer 35 defines the plurality of light emitting regions L. Each of the plurality of light emitting devices P includes a first electrode 34, such as an anode, a light emitting function layer 21, such as an organic light emitting function layer, and a second electrode 222, such as a cathode. The first electrode 34, the light emitting function layer 21 and the second electrode 222 are sequentially disposed away from the base substrate 31. The pixel defining layer 35 is located on a side of the plurality of first electrodes 34 of the plurality of light emitting devices P away facing from the base substrate 31.

In this embodiment, the plurality of second electrodes 222 of the plurality of light emitting devices P collectively constitute a continuous second electrode layer 22, and the plurality of light emitting function layers 21 of the plurality of light emitting devices P also collectively constitute a continuous layer. In other embodiments, the plurality of second electrodes 222 of the plurality of light emitting devices P may be spaced apart from each other and/or the plurality of light emitting function layers 21 of the plurality of light emitting devices P may be spaced apart from each other.

In an embodiment, the array substrate may further include a thin film packaging layer 23 disposed on the second electrode layer 22, as shown in FIG. 6. The thin film packaging layer 23 may be an inorganic thin film or an inorganic-organic composite thin film.

In an embodiment, as shown in FIG. 6, the array substrate may further include a buffer layer 32 disposed on the base substrate 31; a plurality of thin film transistors T arranged in an array and disposed on the buffer layer 32; and a second planarization layer 33 disposed on the plurality of thin film transistors T. A via hole 331 is formed in the second planarization layer 33, so that the first electrode 34 to be subsequently formed may be electrically connected to a source electrode S or a drain electrode D of the corresponding thin film transistor T through the via hole 331.

In an embodiment, the array substrate further includes a spacer 36 disposed on the pixel defining layer 35.

In an embodiment, as shown in FIGS. 6 and 9, the thin film transistor T may further include: a semiconductor layer 41 disposed on the buffer layer 32; a gate insulating layer 42 disposed on the semiconductor layer 41; a gate electrode G disposed on the insulating layer 42; an interlayer insulating layer 43 disposed on the gate electrode G; and both a source electrode S and a drain electrode D disposed on the interlayer insulating layer 43.

In actual applications, the array substrate may further include a second thin film packaging layer disposed on the black matrix according to a specific structure of the array substrate, alternatively, the second thin film packaging layer may also be disposed on the color filter layer. The specific location of the second thin film packaging layer may be determined according to the actual requires, which is not specifically limited in the present disclosure.

An embodiment of the present disclosure provides a display panel. The display panel includes the array substrate described in any of the above embodiments.

The various embodiments in the present disclosure are described in a progressive manner, and each embodiment focuses on differences from other embodiments, and the same or similar portions between the various embodiments may be referred to each other.

Finally, it should also be noted that in the present disclosure, relational terms such as first and second are used merely to distinguish one entity or operation from another entity or operation, and do not necessarily require or imply that there is any such actual relationship or order between these entities or operations. Furthermore, the terms "including", "comprising", or any other variant thereof are intended to cover a non-exclusive inclusion, so that a process, method, product, or device that includes a series of elements includes not only those elements, but also other elements not explicitly listed, or elements that are inherent to the process, method, product, or device. An element that is defined by the phrase "comprising a . . . " does not exclude the presence of additional elements in the process, method, product, or device that includes the element without more limitations.

The method of preparing an array substrate, an array substrate and a display panel provided by the present disclosure are described in detail above. The specific examples are used herein to explain the principles and implementation manners of the present disclosure. The description of the above embodiments is merely used for understanding the method of the present disclosure and its core idea. Meanwhile, for those skilled in the art, in the light of the idea of the present disclosure, there will be changes in the specific embodiment and the scope of application. It should not be construed as limiting the present disclosure.

What is claimed is:

1. A method of preparing an array substrate, comprising:
providing a base substrate;
forming a plurality of light emitting devices arranged in an array on the base substrate;
covering the base substrate, on which the plurality of light emitting devices are formed, with a black matrix material;
activating the plurality of light emitting devices to expose the black matrix material; and
developing the exposed black matrix material to form a black matrix,
wherein the step of forming a plurality of light emitting devices arranged in an array on the base substrate comprises:
forming a plurality of first electrodes arranged in an array on the base substrate;
forming a pixel defining, layer on the base substrate on which the plurality of first electrodes are formed; and
forming a light emitting function layer and a second electrode layer in sequence on the base substrate on which the pixel defining layer is formed,
wherein the pixel defining layer defines a plurality of light emitting regions arranged in an array, the plurality of light emitting regions are in one-to-one correspondence with the plurality of first electrodes, an orthographic projection of each of the light emitting regions on the base substrate falls within an orthographic projection of the corresponding first electrode on the base substrate, and
wherein each of the light emitting function layer and the second electrode layer covers at least the plurality of light emitting regions wherein the black matrix remains only at the edges of the plurality of light emitting devices.

2. The method according to claim 1, wherein before the step of activating the plurality of light emitting devices to expose the black matrix material, the method further comprises:
removing the black matrix material on a peripheral electrode in a peripheral region of the base substrate to expose the peripheral electrode by a patterning process, the peripheral electrode being used for providing a driving signal to the plurality of light emitting devices; and wherein the step of activating the plurality of light emitting devices to expose the black matrix material comprises:

providing the driving signal by the peripheral electrode to activate the plurality of light emitting devices to expose the black matrix material.

3. The method according to claim 1, further comprising:

forming a plurality of color filter layers arranged in an array on the base substrate on which the black matrix is formed, wherein the plurality of color filter layers are in one-to-one correspondence with the plurality of light emitting regions, and an orthographic projection of each of the plurality of color filter layers on the base substrate covers an orthographic projection of the corresponding light emitting region on the base substrate.

4. The method according to claim 3, further comprising:

forming a first planarization layer on both the black matrix and the plurality of color filter layers.

5. The method according to claim 1, wherein before the step of covering the base substrate on which the plurality of light emitting devices are formed with a black matrix material, the method further comprises:

forming a thin film packaging layer on the second electrode layer.

6. The method according to claim 5, wherein the thin film packaging layer is an inorganic thin film or an inorganic-organic composite thin film.

7. The method according to claim 1, wherein before the step of forming a plurality of light emitting devices arranged in an array on the base substrate, the method further comprises:

forming a plurality of thin film transistors arranged in an array on the base substrate, wherein the plurality of thin film transistors are in one-to-one correspondence with the plurality of first electrodes, and a source electrode or a drain electrode of each of plurality of the thin film transistors is electrically connected to the corresponding first electrode.

8. The method according to claim 7, wherein before the step of forming a plurality of thin film transistors arranged in an array on a base substrate, the method further comprises:

forming a buffer layer on the base substrate, wherein the plurality of thin film transistors arranged in the array are formed on the buffer layer.

9. The method according to claim 1, wherein the black matrix material comprises a positive photoresist containing black pigments.

* * * * *